US006074954A

United States Patent [19]
Lill et al.

[11] Patent Number: 6,074,954
[45] Date of Patent: Jun. 13, 2000

[54] PROCESS FOR CONTROL OF THE SHAPE OF THE ETCH FRONT IN THE ETCHING OF POLYSILICON

[75] Inventors: Thorsten Lill, Sunnyvale; Michael Grimbergen, Redwood City, both of Calif.

[73] Assignee: Applied Materials, Inc, Santa Clara, Calif.

[21] Appl. No.: 09/144,008

[22] Filed: Aug. 31, 1998

[51] Int. Cl.$^7$ .................................................. H01L 21/3065
[52] U.S. Cl. ............................................ 438/710; 438/719
[58] Field of Search ................................... 438/710, 719, 438/726, 732

[56] References Cited

U.S. PATENT DOCUMENTS

| | | | |
|---|---|---|---|
| 4,755,476 | 7/1988 | Böhm et al. | 437/31 |
| 4,895,810 | 1/1990 | Meyer et al. | 431/41 |
| 5,120,668 | 6/1992 | Hsu et al. | 437/41 |
| 5,160,407 | 11/1992 | Latchford et al. | 156/656 |
| 5,182,234 | 1/1993 | Meyer | 437/233 |
| 5,229,315 | 7/1993 | Jun et al. | 437/67 |
| 5,256,583 | 10/1993 | Hollinger | 437/41 |
| 5,283,201 | 2/1994 | Tsang et al. | 438/212 |
| 5,318,665 | 6/1994 | Oikawa | 156/643 |
| 5,374,584 | 12/1994 | Lee et al. | 437/69 |
| 5,449,433 | 9/1995 | Donohoe | 156/643.1 |
| 5,453,156 | 9/1995 | Cher et al. | 156/643.1 |
| 5,492,850 | 2/1996 | Ryou | 437/52 |
| 5,656,535 | 8/1997 | Ho et al. | 438/386 |
| 5,731,130 | 3/1998 | Tseng | 430/316 |

FOREIGN PATENT DOCUMENTS

| | | | |
|---|---|---|---|
| 0272143 | 6/1988 | European Pat. Off. | H01L 21/306 |
| 0565212 | 10/1993 | European Pat. Off. | H01L 21/306 |
| 0814500 | 12/1997 | European Pat. Off. | H01L 21/321 |
| 0821409 | 1/1998 | European Pat. Off. | H01L 21/8242 |
| 0822593 | 2/1998 | European Pat. Off. | H01L 21/8242 |

OTHER PUBLICATIONS

Y. Ye et al., "0.35–Micron and Sub–0.35–Micron Metal Stack Etch in a DPS Chamber—DPS Chamber and Process Characterization", *Electrochemical Society Proceedings*, vol. 96–12, pp. 222–233 (1996).

Yeom et al., "Polysiliocon Etch Back Plasma Process Using HBr, $Cl_2$, and $SF_6$ Gas Mixtures for Deep–Trench Isolation", *J. Electrochem. Soc.*, vol. 139, No. 2, pp. 575–579 (1992).

*Primary Examiner*—Benjamin L. Utech
*Assistant Examiner*—Donald L Champagne
*Attorney, Agent, or Firm*—Shirley Church

[57] ABSTRACT

The present disclosure pertains to our discovery that the use of a particular combination of etchant gases results in the formation of a substantially flat etch front for polysilicon etching applications. In general, the process of the invention is useful for controlling the shape of the etch front during the etchback of polysilicon. Typically, the process comprises isotropically etching the polysilicon using a plasma produced from a plasma source gas comprising a particular combination of reactive species which selectively etch polysilicon. The plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof. One preferred mixture is $SF_6$, $Cl_2$ and HBr. A preferred method of the invention, used to perform recess etchback of a polysilicon-filled trench in a substrate, comprises the following steps: a) providing a trench 3 formed in a semiconductor structure, wherein the structure includes a substrate 2, at least one gate dielectric layer 6 overlying a surface of the substrate, and at least one etch barrier layer 8 overlying the gate dielectric layer; b) forming a conformal dielectric film 10 overlying the etch barrier layer and the sidewall and bottom of the trench; c) filling the trench with a layer of polysilicon 12 which overlies the conformal dielectric film; and d) isotropically etching the polysilicon back to a predetermined depth within the trench using a plasma produced from the invention plasma source gas. Also disclosed herein is a method of forming a trench capacitor in a single-crystal silicon substrate, the trench capacitor including a dielectric collar and a buried strap.

15 Claims, 8 Drawing Sheets

PROCESS FOR CONTROL OF THE SHAPE OF THE ETCH FRONT IN THE ETCHING OF POLYSILICON

BACKGROUND OF THE INVENTION

1. Field of the Invention

The present invention pertains to a process for control of the shape of the etch front in polysilicon etching applications. The present invention also pertains to a method for recess etchback of a polysilicon-filled trench formed in a substrate, as well as a method for forming a polysilicon-filled trench capacitor in a single-crystal silicon substrate, the trench capacitor including a dielectric collar and a buried strap.

2. Brief Description of the Background Art

There are a number of methods described in the art for etching polysilicon films and for the etchback of polysilicon. Several of these methods are described below.

U.S. Pat. Nos. 4,895,810 and 5,182,234, issued Jan. 23, 1990 and Jan. 26, 1993, respectively, to Meyer and Hollinger et al., disclose depositing a dopant-opaque layer of polysilicon on a gate oxide on the upper substrate surface to serve as a pattern definer during fabrication of a device, to provide control over successive P and N doping steps used to create the necessary operative junctions within a silicon substrate and the conductive structure formed atop the substrate. A trench is formed in the upper silicon surface and a source conductive layer is deposited to electrically contact the source region as a gate conductive layer is deposited atop the gate oxide layer. The trench sidewall is profile-tailored using a novel $O_2$—$SF_6$ plasma etch technique. An oxide sidewall spacer is formed on the sides of the pattern definer and gate oxide structures before depositing the conductive material. A planarizing layer is applied and used as a mask for selectively removing any conductive material deposited atop the oxide spacer. The polysilicon layer on the oxide is reduced in thickness during trenching so that any conductive material deposited atop the spacers protrude upward for easy removal of excess conductive material. The sidewall spacers can be sized, either alone or in combination with profile-tailoring of the trench, to control source-region width (i.e., parasitic pinched base width) and proximity of the source conductor to the FET channel. Electrical contact between the source conductive layer and the source regions is enhanced by forming a low-resistivity layer between them.

U.S. Pat. No. 5,229,315, issued Jul. 20, 1993 to Jun et al., discloses a method for forming an isolated film on a semiconductor device comprising the steps of: forming a deep and narrow cylindrical groove in a substrate; filling up the groove with an oxide film, and oxidizing a polysilicon layer encircled by the groove, thereby forming an isolated film in the shape of a cylinder. The method preferably includes the following steps: forming a pad oxide film and a nitride film on the substrate in that order; forming a mask window using a photoetching process, for depositing a polysilicon layer and for implanting field ions in the polysilicon layer; forming an insulated layer over the mask region for leveling the surface and then etching back the insulated layer to level the surface; etching the polysilicon layer and the substrate using a self-alignment method to form a deep cylindrical groove within the substrate; forming a CVD oxide film into the groove and over the polysilicon layer and etching it back by using a dry etching method to expose the polysilicon layer; and oxidizing the polysilicon layer to remove the nitride film.

U.S. Pat. No. 5,318,665, issued Jun. 7, 1994 to Oikawa, discloses the use of a mixed gas of HBr and Ar (10 to 25%) or a mixed gas of HBr, Ar (5 to 25%) and $O_2$ (0.2 to 2%) in etching a polysilicon film having a large step difference by means of the reactive ion etch (RIE) method.

U.S. Pat. No. 5,656,535, issued Aug. 12, 1997 to Ho et al, discloses a simplified method of fabricating a storage node for a deep trench-based DRAM on a semiconductor substrate. The method involves etching a trench in a surface of the substrate and then forming a layer of dielectric material on a sidewall of the trench, the top portion of which is subsequently removed from the sidewall. Next, a layer of oxide is grown on the exposed portion of the sidewall. A portion of this layer of oxide is then removed from the sidewall in order to orient the layer of oxide a predetermined distance from the surface of the substrate. Finally, the trench is filled with a semiconductive material. The disclosure of this patent is hereby incorporated by reference herein in its entirety.

European Patent Publication Nos. 0272143 and 0565212, published Jun. 22, 1988 and Oct. 13, 1993, and assigned to the assignee of the present invention, disclose a process for etching single crystal silicon, polysilicon, silicide and polycide using iodinate or brominate gas chemistry. The iodinate/brominate gas chemistry etches narrow deep trenches with very high aspect ratios and good profile control and without black silicon formation or other undesirable phenomena. The disclosure of these patent publications are hereby incorporated by reference herein in their entireties.

European Patent Publication No. 0814500, published Dec. 29, 1997, and assigned to the assignee of the present invention, discloses a method for etching metal silicide layers and polysilicon layers on a substrate with high etching selectivity and anisotropic etching properties. In the method, the substrate is placed in a plasma zone and process gas comprising chlorine, oxygen and, optionally, helium gas is introduced into the plasma zone. A plasma is formed from the process gas to etch the metal silicide layer at high etching selectivity relative to etching of the polysilicon layer, while providing substantially anisotropic etching of the metal silicide and polysilicon layers. Preferably, the plasma is formed using combined inductive and capacitive plasma sources. The disclosure of this patent publication is hereby incorporated by reference herein in its entirety.

European Patent Publication No. 0821409, published Jan. 28, 1998, by Coronel et al., discloses a collar etch method from DRAM cell. In the manufacture of 16 Mbits DRAM chips, a polysilicon strap is used to provide an electrical contact between the drain region of the active NFET device and one electrode of the storage capacitor for each memory cell. In a conventional fabrication process, a $Si_3N_4$ pad layer is deposited onto the bare silicon substrate, then patterned. Next, deep trenches are formed in the substrate by dry etching. A classic ONO layer is conformally deposited into the trenches. The trenches are filled with undoped polysilicon. About 2.5 $\mu$m of undoped polysilicon is removed from the trench in a plasma etcher. A TEOS $SiO_2$ collar layer is conformally deposited, then anisotropically dry etched to leave only the so-called collar. Because trenches are present at the substrate surface, the thickness of the TEOS $SiO_2$ collar is not uniform. The above-referenced patent publication proposes a novel, highly selective dry etch method to anisotropically etch the TEOS $SiO_2$ collar while preserving the $Si_3N_4$ pad layer thickness uniformity. A chemistry having a high TEOS $SiO_2/Si_3N_4$ selectivity (i.e., which etches TEOS $SiO_2$ faster than $Si_3N_4$ by a factor of at least six) is used to etch the TEOS $SiO_2$ collar layer. $C_4F_8$/Ar and $C_4F_8$/Ar/CO mixtures which have respective selectivities approximately equal to 9:1 and 15:1 (depending on gas ratios) are adequate in all respects. When the surface of the $Si_3N_4$ pad layer is reached (this can be accurately detected), the etch is continued by an overetch of the TEOS $SiO_2$ layer to ensure a complete removal of the horizontal portions thereof. The disclosure of this patent publication is hereby incorporated by reference herein in its entirety.

European Patent Publication No. 0822593, published Feb. 4, 1998, by Haue et al., discloses a method of forming field effect transistors (FETs) on a silicon wafer. First, trenches are formed in a surface of the silicon wafer. An ONO layer is formed on the surface, lining the trenches. Potassium is diffused along the ONO layer. Part of the ONO layer is removed to expose the wafer surface with the ONO layer remaining in the trenches. Gate oxide is formed on the exposed wafer surface. Finally, FET gates are formed on the gate oxide. Preferably, potassium is introduced during chemical-mechanical polishing when the trenches are filed with polysilicon. A slurry containing KOH is used to polish the polysilicon and the potassium diffuses from the slurry along the ONO layer. After chemical-mechanical polishing, the polysilicon in the trenches is recessed by reactive ion etching (RIE) it below the wafer surface. Optionally, after RIE, the wafer may be dipped in a KOH solution. Next, an oxide collar is formed along the ONO layer in the trenches above the recessed polysilicon. The recesses are filled by a second layer of polysilicon that is chemical-mechanical polished with the same slurry to remove polysilicon from the wafer surface. The polished polysilicon may be reactive ion etched until it is essentially coplanar with the wafer surface. The resulting FET has a thicker gate oxide along its sides than in the center of its channel.

Geun-Young Yeom et al. (*J. Electrochem. Soc., Vol.* 139, No. 2, pp. 575–579, February 1992) discloses a polysilicon etchback plasma process using HBr, $Cl_2$, and $SF_6$ gas mixtures for deep trench isolation. Etchback of polysilicon used for refilling deep trenches isolating bipolar devices has been investigated in a magnetically enhanced reactive ion etcher using HBr, $Cl_2$, and $SF_6$ gas combinations. Etch rates, uniformities, and loading effects have been studied as a function of gas mixtures. Polysilicon etchback processes with uniformity better than 2%, polysilicon etch rate larger than 5000 Å/min, and loading factor less than 1.3 were obtained with a gas mixture consisting of less than 9 sccm $SF_6$ in a predominant HBr and $Cl_2$ mixture. It was found that the etch roughness and surface profile of the resulting trench polysilicon was a strong function of $Cl_2$ percentage in the mixture. The controllable trench polysilicon etchback profile with smooth surface and curvature was obtained by using 60 sccm HBr and 50 sccm $Cl_2$ gas mixture with 6 sccm $SF_6$ gas flow.

During the fabrication of deep trenches of the kind used in semiconductor devices, the process frequently involves at least one step in which the trench is filled with polysilicon, which is subsequently partially etched back within the trench. In some instances, there may be more than one filling and etchback step.

As device geometries continue to scale down, it becomes increasingly difficult to control the shape of the surface which is being etched. This is particularly true with regard to deep trenches having feature sizes of 0.3 $\mu$m or less and aspect ratios in excess of 20.

The shape of the leading edge of the surface being etched, which is commonly referred to as the "etch front", is of critical importance. If the shape of the etch front is not flat, sculpturing of subsequently deposited layers of material (e.g., during collar etch) may be difficult and the accuracy of interferometric endpoint determination during etch processing may be reduced.

The problem of controlling the shape of the etched surface during a polysilicon etchback process for trenches having a feature size (i.e., width) of 1.0 to 1.8 $\mu$m and an aspect ratio of about 2:1 to about 6:1 was discussed in the article by Geun-Young Yeom et al., which was referenced above. Since the time that the article was published in 1992, feature size has decreased to 0.25 $\mu$m and smaller, and aspect ratios have increased to 40:1 and higher, exacerbating the problem. The present invention discloses a method of controlling the shape of the etch front during the etchback of polysilicon. The method can be used to form an etch front configuration which compensates for other factors during subsequent processing steps in a manner which assists in planarization of a filled trench surface. In the case of an etchback of a polysilicon-filled trench capacitor, control of the etch front ensures the complete removal of dielectric components from interior trench surfaces and sidewall profile control.

SUMMARY OF THE INVENTION

Applicants have discovered a particular combination of etchant gases which can be used to create a substantially flat etch front for polysilicon etching and etchback applications.

Accordingly, disclosed herein is a process for control of the shape of the etch front during the etching of polysilicon, and particularly in the etchback of polysilicon. The process comprises isotropically etching polysilicon using a plasma produced from a plasma source gas comprising particular reactive species which selectively etch the polysilicon. The plasma source gas comprises from about 80% to about 95% by volume of a fluorine-comprising gas, and from about 5% to about 20%, most preferably about 10%, by volume of an additive gas selected from a group consisting of a bromine-comprising gas (such as HBr), a chlorine-comprising gas (such as $Cl_2$ or HCl), an iodine-comprising gas (such as HI), or a combination thereof. Bromine-comprising and chlorine-comprising gases, and combinations thereof, are the most preferred additive gases.

The fluorine-comprising gas is preferably $SF_6$ The plasma source gas may also include an essentially nonreactive gas, such as helium or argon, which functions as a diluent for the reactive species.

Also disclosed herein is a method for recess etchback of a polysilicon-filled trench formed in a substrate. The method comprises the steps of: a) providing a trench formed in a semiconductor structure, wherein the structure includes a substrate, at least one gate dielectric layer overlying a surface of the substrate, and at least one etch barrier layer overlying the gate dielectric layer; b) forming a conformal dielectric film overlying the etch barrier layer and the sidewall and bottom of the trench; c) filling the trench with a layer of polysilicon which overlies the conformal dielectric film; and d) isotropically etching the polysilicon back to a predetermined depth within the trench using a plasma produced from a plasma source gas comprising a reactive species which selectively etches polysilicon, wherein the plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof.

Also disclosed herein is a method of forming a trench capacitor in a single-crystal silicon substrate, the trench capacitor including a dielectric collar and a buried strap. The method comprises the steps of: a) providing a trench formed in a semiconductor structure, wherein the structure includes a single-crystal silicon substrate, at least one gate dielectric layer overlying a surface of the substrate, and at least one etch barrier layer overlying the gate dielectric layer; b) forming a conformal dielectric film overlying the etch barrier layer and the sidewall and bottom of the trench; c) filling the trench with a layer of polysilicon which overlies the conformal dielectric film; d) isotropically etching the polysilicon back to a predetermined depth within the trench using a plasma produced from a plasma source gas comprising a reactive species which selectively etches polysilicon, wherein the plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof; e) forming a collar comprising a conformal layer of silicon oxide over the etch barrier layer, the sidewall of the trench, and the portion of the polysilicon which was exposed during the etching step (d); f) anisotropically etching the silicon oxide collar to expose the underlying polysilicon; g) refilling the trench with polysilicon; h) isotropically etching the polysilicon back to a second predetermined depth within the trench using a plasma produced from a plasma source gas comprising a reactive species which selectively etches polysilicon, wherein the plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof; i) performing a wet etch step to remove an upper portion of the silicon oxide collar to a third predetermined depth; j) refilling the trench with polysilicon; and k) isotropically etching the trench to remove the polysilicon to a fourth predetermined depth within the trench and to remove a portion of the single-crystal silicon substrate from the top portion of the sidewall above the silicon oxide collar, thereby forming a buried strap. Preferably, polysilicon containing a dopant such as arsenic is used for at least the last polysilicon fill step (step 1), in order to facilitate electron transfer through the buried strap.

DETAILED DESCRIPTION OF THE INVENTION

The present invention pertains to a process for control of the shape of the etch front in the etching of polysilicon. In particular, applicants have discovered a particular combination of etchant gases which results in the formation of a substantially flat etch front for polysilicon etching and etchback applications.

I. Definitions

As a preface to the detailed description, it should be noted that, as used in this specification and the appended claims, the singular forms "a", "an", and "the" include plural referents, unless the context clearly dictates otherwise. All percentages (%) listed for gas constituents are % by volume, unless otherwise indicated.

Specific terminology of particular importance to the description of the present invention is defined below.

The term "aspect ratio" refers to the ratio of the height dimension to the width dimension of particular openings. For example, a via opening which typically extends in a tubular form through multiple layers has a height and a diameter, and the aspect ratio would be the height of the tubular divided by the diameter. The aspect ratio of a trench would be the height of the trench divided by the average minimal width of the trench.

The term "dielectric" refers to a nonconducting material that can sustain a steady electric field and serve as an electrical insulator.

The term "etchant gas" refers to, but is not limited to, a gas which generates reactive species which are capable of etching polysilicon.

The term "etch front" refers to the shape of the leading edge of the surface being etched. For example, the etch front may be substantially flat (i.e., horizontal), or it may, for example, have a V-shape, W-shape, U-shape, or ∩-shape.

The term "feature" refers to, but is not limited to, contacts, vias, trenches, and other structures which make up the topography of the substrate surface.

The term "feature size" typically refers to the smallest dimension of a feature (i.e., the shortest distance between the sidewalls of a feature).

The term "high density plasma" refers to a plasma having a density of more than $1\times10^{12}$ ions/cm$^3$.

The term "inductively coupled plasma" refers to a plasma that is mainly sustained by the electromagnetic field of at least one inductive coil antenna.

The term "isotropic etching" refers to an etching process where etching can proceed in all directions at once, with roughly the same etch rate.

The term "polysilicon" refers to polycrystalline silicon, which may be doped with, for example, arsenic, phosphorus, antimony, or boron.

The term "recess etch" refers to, but is not limited to, a process wherein a material (such as polysilicon) which has been previously deposited onto a topography on a substrate surface is etched back to a predetermined depth within a recess in the topography.

The term "selectivity" is used to refer to a) a ratio of etch rates of two materials; and b) a condition achieved during etch when etch rate of one material is increased in comparison with another material.

The term "silicon" refers to single-crystal silicon.

The term "silicon nitride" refers to a silicon and nitrogen-comprising compound having the formula $SiN_x$, wherein $1.2 \leq x \leq 1.3$.

The term "silicon oxide" refers to a silicon and oxygen-comprising compound having the formula $SiO_x$, wherein $1.4 \leq x \leq 2.1$.

The term "silicon oxynitride" refers to a silicon, oxygen, and nitrogen-comprising compound having the formula $SiO_xN_y$, wherein $1.0 \leq x \leq 1.3$ and $0.3 \leq y \leq 0.35$.

The term "wet etching" refers to etching using a liquid reagent.

II. Apparatus for Practicing the Invention

The etch process was carried out in a Silicon Etch DPS (Decoupled Plasma Source) CENTURA® etch system available from Applied Materials, Inc. of Santa Clara, Calif. A detailed description of a Decoupled Plasma Source of the kind used by applicants was described by Yan Ye et al. at the Proceedings of the Eleventh International Symposium of Plasma Processing, May 7, 1996, and as published in the *Electrochemical Society Proceedings,* Volume 96-12, pp. 222–233 (1996). The plasma processing chamber enables the processing of an 8 inch (200 mm) diameter silicon substrate surface. The apparatus, having a similar design, is currently being scaled up for application to a 12 inch (300 mm) substrate surface.

Figure 2:
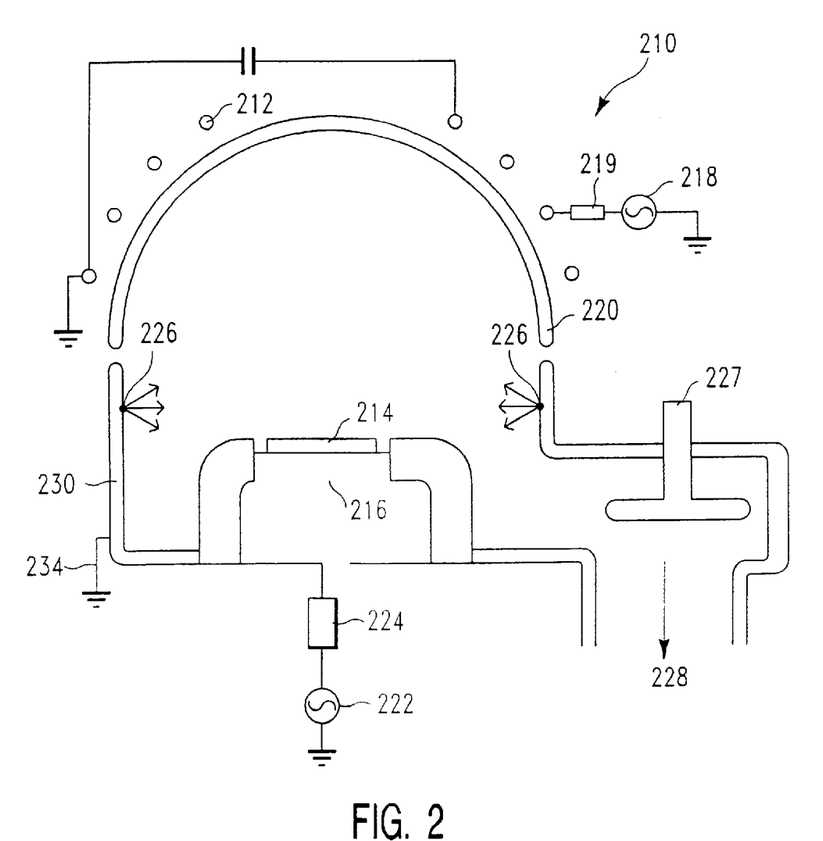
FIG. 2 is a schematic of a plasma processing apparatus of the kind used in carrying out the etching processes described herein.

A schematic of the processing chamber is shown in FIG. 2 which shows an etching process chamber 210, which is constructed to include at least one inductive coil antenna segment 212, positioned exterior to a dielectric, shaped ceiling 220, and connected to a radio frequency (RF) power generator 218 (which may be a source power generator with a frequency tunable around 12.56 MHz for impedance matching at different plasma conditions, or which may be a source power generator of fixed frequently which is connected through an impedance matching network 219). Process chamber 210 also includes a substrate 214 support pedestal (cathode) 216 which is connected to an RF frequency power generator 222 (bias power generator at a fixed frequency ranging between about 400 kHz and 13.56 MHz) through an impedance matching network 224, and a conductive chamber wall 230 which serves as the electrical ground 234.

The semiconductor substrate 214 is placed on the support pedestal 216 and gaseous components are fed into the process chamber through entry ports 226. A plasma is ignited in process chamber 210 by applying RF powers 218 and 222. Pressure interior to the etch process chamber 210 is controlled using a vacuum pump (not shown) and a throttle valve 227 situated between process chamber 210 and the vacuum pump. The temperature on the surface of the etch chamber walls is controlled using liquid-containing conduits (not shown) which are located in the walls of the etch chamber 210. The temperature of the semiconductor substrate is controlled by stabilizing the temperature of the support pedestal and flowing helium gas in the channels formed by the back of the substrate and grooves (not shown) on the pedestal 216 surface. The helium gas is used to facilitate heat transfer between the substrate and the pedestal. During the etch process, the substrate surface is gradually heated by the plasma to a steady state temperature which is approximately 5–30° C. higher than the substrate support pedestal temperature, depending on the process conditions. It is estimated that the substrate surface temperature was typically around 25° C. to about 35° C. during most of our experiments. The surface of the etching chamber 210 walls was maintained at about 65° C. using the cooling conduits previously described.

The RF power applied to the inductive coil antenna segment 212 and to the substrate pedestal 216 may be selected to range from about 50 kHz to as high as 13.56 MHz, and may vary in wattage from a few hundred watts to several thousand watts. The power applied to the substrate pedestal 216 may be DC rather than RF alternating current.

Figure 1:
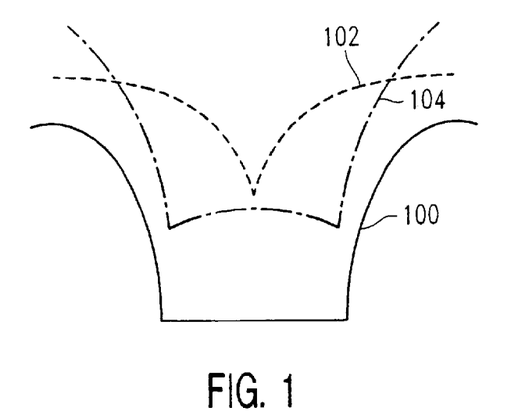
FIG. 1 shows a V-shaped etch front 102 and a W-shaped etch front 104.

III. The Process for Control of the Shape of the Etch Front in Etching of Polysilicon When performing etching of polysilicon, and particularly when performing recess etch of polysilicon-filled trenches, it is important for the etch front to be as flat and as smooth as possible. Non-flat etch fronts make sculpturing of subsequently deposited layers of material (e.g., during collar etch) difficult and may reduce the accuracy of interferometric endpoint determination during etch processing. In isotropic recess etch of polysilicon, the etch front is often concave (i.e., funnel-shaped) due to voids and/or dips in the polysilicon fill layer, especially for trenches having very small feature sizes of 0.25 μm and below. FIG. 1 shows a funnel-shaped or V-shaped etch front 102, where etching is deeper at the center of the trench 100 than toward the sidewalls, which often results during isotropic recess etch of polysilicon in small feature size trenches.

Applicants have discovered that the use of a plasma source gas containing from about 80% to about 95% by volume of a fluorine-comprising gas and from about 5% to about 20% (preferably, about 10%) by volume of an additive gas comprising bromine, chlorine, and/or iodine results in the formation of a W-shaped etch front 104, shown in FIG. 1, where etching is deeper toward the sidewalls of the trench 100 and more shallow at the center of the trench. The W-shaped etch front 104 compensates for the V-shaped initial surface 102 of the polysilicon filling the trench, resulting in the formation of a substantially flat etch front as etching progresses.

In general, the process of the invention comprises isotropically etching polysilicon using a plasma produced from a plasma source gas comprising a reactive species which selectively etches polysilicon. The plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof. Bromine-comprising and chlorine-comprising gases, and combinations thereof, are the more preferred additive gases. For example, and not by way of limitation, the additive gas may comprise $HBr$, $CH_3Br$, $CH_2Br_2$, $Cl_2$, $HCl$, $HI$, or a combination thereof, with a combination of HBr and Cl$_2$ being most preferred.

The particular additive gas, or combination of additive gases, used will depend upon a number of factors, such as the etch depth. For example, HBr reacts more slowly with polysilicon than does chlorine and, as such, HBr provides a more controlled etch. HBr also has a stronger effect on the etch profile than does chlorine, but the etch selectivity for polysilicon over the silicon nitride etch barrier is lower with HBr than with chlorine. Therefore, for shallow etch depths (which typically have very short etch times, often under 20 seconds, and where etch barrier loss is not as critical), it would be preferred to increase the HBr content of the plasma source gas in order to slow down the etch rate to provide a more controlled etch profile.

On the other hand, chlorine has less of an effect on the etch profile than does HBr, and the etch selectivity for polysilicon over the silicon nitride etch barrier material is greater with chlorine than with HBr. Therefore, for deep etches, where a more rapid etch rate might be desired, and where etch selectivity for polysilicon over silicon nitride is crucial, the chlorine content of the plasma source gas should be increased.

The principal component of the plasma source gas, which makes up about 80–95% of the plasma source gas composition, comprises a fluorine-comprising gas, such as SF$_6$, SF$_4$, S$_2$F$_2$, S$_2$F$_{10}$, NF$_3$, and combinations thereof. Plasma source gases which contain (in addition to fluorine) potentially reactive species such as oxygen or carbon, such as F$_2$O, F$_2$O$_2$, NOF, NO$_2$F, CF$_4$, CH$_2$F$_2$, CHF$_3$, CH$_3$F, and combinations thereof, may also be used, but are less preferred. Gases comprising oxygen are less preferred because oxygen dramatically reduces the etch selectivity toward polysilicon over the silicon nitride etch barrier. The use of carbon-comprising gases may result in the formation of undesirable polymers. The most preferred fluorine-comprising gas is SF$_6$.

In addition to the etchant gases, the plasma source gas may also include an essentially nonreactive gas, typically a noble gas such as helium or argon, as a diluent for the reactive species, in order to slow down the etching reaction. Therefore, for shallow etch depths, it might be desirable to increase the concentration of the nonreactive gas in the plasma source gas to provide for a slower, more controlled etch. The nonreactive gas may be present in the plasma source gas at a ratio of up to 9:1 to the other constituents of the plasma source gas. (NOTE: The percentages set forth above are based on the sum of the source gases which produce reactant species and do not include nonreactive, diluent gases which may be used in any quantity which is beneficial, depending on the apparatus used and the process conditions in general. One skilled in the art can determine with minimal experimentation a proper amount of a diluent gas which should be used.)

When an Applied Materials' Silicon Etch DPS (Decoupled Plasma Source) CENTURA® etch system is used, for example, a preferred plasma source gas would comprise the following gases at the following flow rates: 20 to 200 sccm SF$_6$, 0 to 50 sccm HBr, 0 to 50 sccm Cl$_2$, and 0 to 200 sccm He; preferably, 30 to 100 sccm SF$_6$, 0 to 10 sccm HBr, 0 to 10 sccm Cl$_2$, and 0 to 100 sccm He.

Other typical process conditions for the isotropic polysilicon etchback are set forth in Table One and discussed below:

TABLE ONE

Typical Process Conditions for Isotropic Polysilicon Etchback

| | |
|---|---|
| Substrate Temperature | 65° C. |
| Process Chamber Wall Temperature | 20° C. |
| Chamber Pressure | 10–20 mT |
| RF Source Power | 50–800 W |
| RF Source Frequency | 12–14 MHz |
| Bias Power | self-bias (~ −5 to −10 eV) |

Substrate bias reduces the selectivity of the plasma source gas to the silicon nitride etch barrier. Therefore, no bias power is typically applied to the substrate, and a relatively high chamber pressure of about 10–20 mT (preferably, about 15–20 mT) is used to minimize the amount of self-bias on the substrate.

The lower the source power, the slower the etch rate. Therefore, for shallow etches, a source power toward the lower end of the range (i.e., approximately 50–200 W) is preferred.

Section IV and Example One, below, describe a preferred embodiment method for recess etchback of a polysilicon-filled trench which incorporates the process of the present invention for control of the shape of the etch front in etchback of polysilicon, as described above.

IV. Method for Recess Etch Back of a Polysilicon-Filled Trench

The method of the invention for recess etchback of a polysilicon-filled trench formed in a substrate comprises the following general steps:

a) providing a trench formed in a semiconductor structure, wherein the structure includes a substrate, at least one gate dielectric layer overlying a surface of the substrate, and at least one etch barrier layer overlying the gate dielectric layer;

b) forming a conformal dielectric film overlying the etch barrier layer and the sidewall and bottom of the trench;

c) filling the trench with a layer of polysilicon which overlies the conformal dielectric film; and d) isotropically etching the polysilicon back to a predetermined depth using a plasma produced from a plasma source gas comprising a reactive species which selectively etches polysilicon, wherein the plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof.

Specific process parameters for the polysilicon recess etchback method are set forth in Example One, below.

EXAMPLE ONE

A gate dielectric layer was formed on a surface of a substrate (in this case, single-crystal silicon). In this instance, the gate dielectric layer was a silicon oxide (SiO$_x$) layer formed by thermal oxidation of the underlying single-crystal silicon substrate, using techniques known in the art. The thickness of the gate dielectric layer on the substrate surface was approximately 50 Å.

A silicon nitride etch barrier layer was then formed overlying the gate dielectric layer. The silicon nitride layer, which functions as an etch stop throughout the method of the invention, was formed to have an initial thickness of approximately 2200 Å. Other possible materials that can serve as etch barrier layers include, without limitation, silicon dioxide, titanium nitride, and metal oxides such as titanium oxide and iridium oxide.

The silicon nitride etch barrier layer was deposited using rapid thermal processing (RTP) chemical vapor deposition (CVD) techniques. The silicon nitride etch barrier layer can alternatively be deposited from TEOS using LPCVD techniques.

A silicon oxide mask layer was then formed overlying the silicon nitride etch barrier layer. The silicon oxide mask layer was formed to have a thickness of approximately 500–700 nm. The silicon oxide mask layer was deposited from TEOS using LPCVD techniques. Alternatively, the mask layer may be BPSG (boron phosphate silicate glass) or BSG (boron silicate glass).

The film stack comprising the gate dielectric layer/silicon nitride etch barrier layer/silicon oxide mask layer was then patterned using photoresist. The photoresist can be any suitable photoresist material known in the art. Patterning of the photoresist will depend on the particular photoresist material used and should be performed according to the photoresist manufacturer's instructions.

An opening was then formed through the patterned film stack to expose a portion of the surface of the underlying silicon substrate. The opening was formed using a reactive ion etching (RIE) mask open process in an Applied Materials' MXP chamber. Gas flow was 50 sccm $CF_4$, 15 sccm $CHF_3$, and 120 sccm Ar. The process chamber pressure was 100 mT. An RF source power of 500 W was provided at a frequency of 13.56 MHz. A magnetic field of 30 gauss was provided.

The photoresist was then removed according to the manufacturer's instructions for the particular photoresist used.

A trench was then etched in the substrate using an Applied Materials' Narrow Gap Deep Trench Etch Chamber (Applied Materials Model Mark II NG).

A wet etch step was then performed to remove the silicon oxide mask layer. The wet etch was performed using a buffered HF solution (6:1 buffer: HF ratio).

Figure 3:
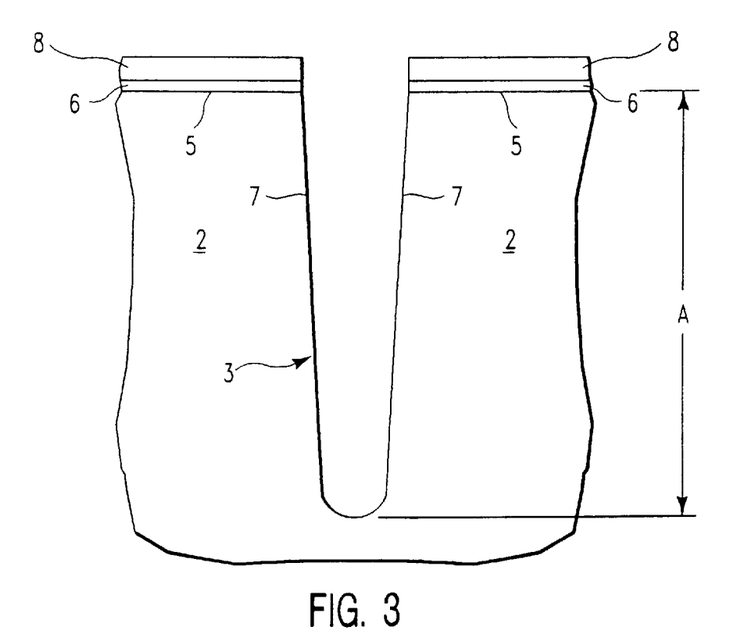
FIG. 3 shows a beginning structure for practicing a preferred embodiment method of the invention. This structure is a single-crystal silicon substrate having a trench formed therein, wherein a gate dielectric layer covers the upper surface of the silicon substrate, and an etch barrier layer overlies the gate dielectric layer.

The resulting structure is shown in FIG. 3. This structure is a single-crystal silicon substrate 2 having a trench 3 formed therein. A gate dielectric layer 6 covers the upper surface 5 of the silicon substrate 2, and an etch barrier layer 8 overlies the gate dielectric layer 6. In this case, the depth A of the trench 3 was approximately 8 $\mu$m. (NOTE: The relative thicknesses of the film layers illustrated in FIGS. 3–13 are not to scale. The drawings are intended only to show the order in which the various layers are deposited on the substrate.)

Figure 4:
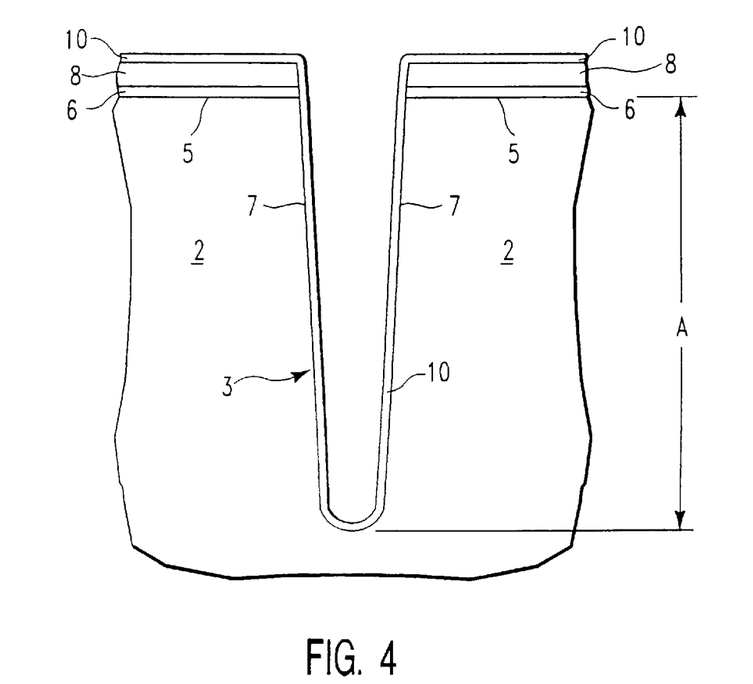
FIG. 4 shows the structure of FIG. 3 after deposition of a conformal dielectric layer over the etch barrier layer and the sidewall and bottom of the trench.

Referring to FIG. 4, a conformal dielectric film 10 was then formed overlying the silicon nitride etch barrier layer 8 and the sidewall 7 and bottom of the trench 3. In this instance, the conformal dielectric film 10 was a multi-layered dielectric film comprising a layer each of silicon oxide, silicon nitride, and silicon oxynitride collectively known as "ONO"—oxide/nitride/oxynitride). The silicon oxide and silicon nitride layers were deposited using RTP CVD techniques. The silicon oxide and silicon nitride layers can alternatively be deposited from TEOS using CVD techniques. The silicon nitride layer was oxidized on top by exposure to $O_2$ to form silicon oxynitride.

The oxide/nitride/oxynitride layers were formed in approximately a 1:1:1 thickness ratio. In this case, the total thickness of the conformal dielectric film 10 (i.e., the ONO layer) was approximately 60–80 Å on the field surface and on the sidewall 7.

Figure 5:
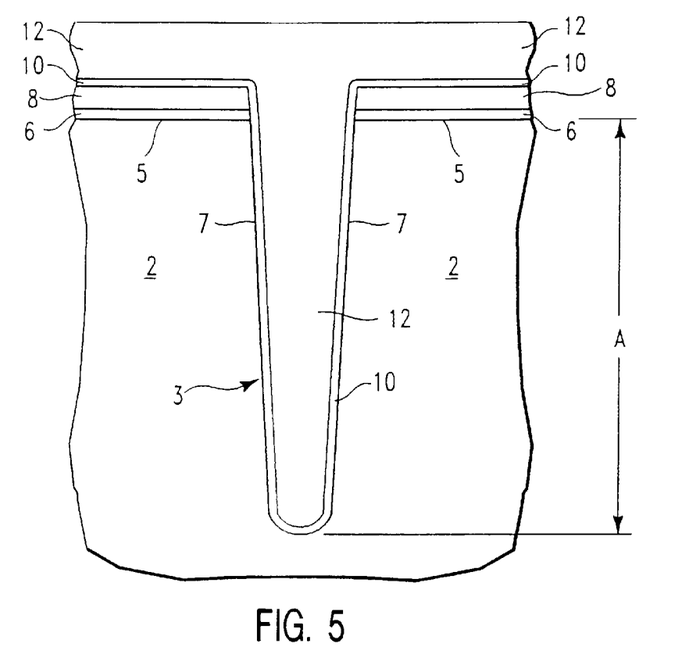
FIG. 5 shows the structure of FIG. 4 after filling of the trench with polysilicon.

Referring to FIG. 5, a layer 12 of polysilicon was then deposited over the conformal dielectric film 10 to fill the trench 3. The polysilicon 12 was deposited by furnace using techniques known in the art.

Figure 6A:
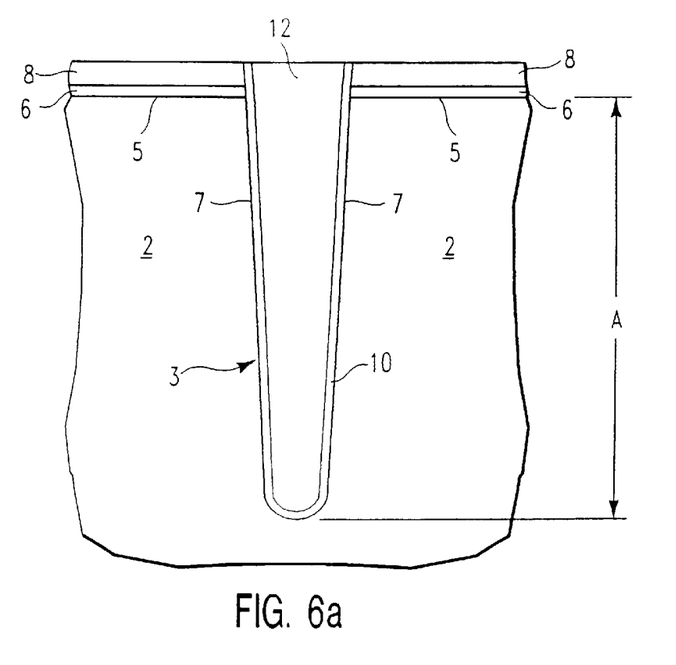
FIGS. 6a and 6b show the structure of FIG. 5 after etchback of the polysilicon layer and the conformal dielectric film to a predetermined depth B ("Recess Etch 1").
Figure 6B:
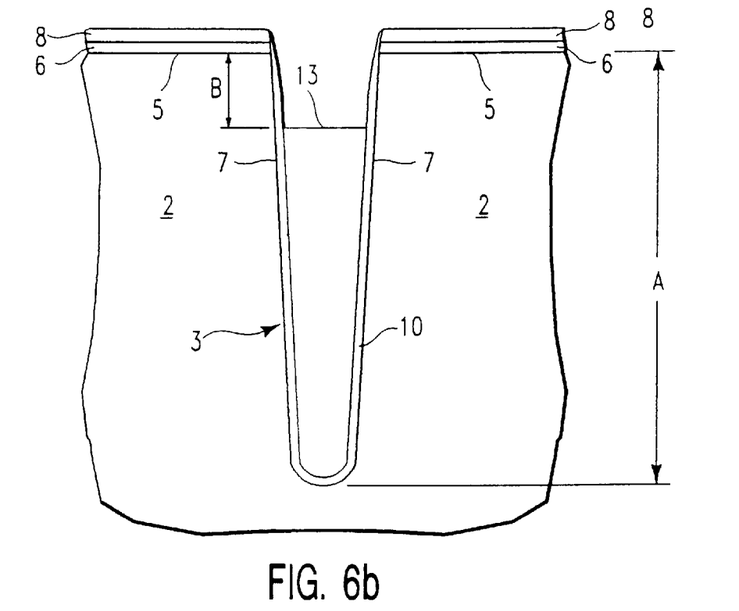

Referring to FIG. 6b, the conformal dielectric film 10 and the polysilicon 12 were then etched back to a predetermined depth B within the trench (in this case, approximately 1.5 $\mu$m) using the plasma source gas composition and general process parameters described in Section III, above. Gas flow was 100 sccm $SF_6$ and 10 sccm $Cl_2$. The process chamber pressure was 20 mT. An RF source power of 600 W was provided at a frequency of 13.56 MHz. No bias power was provided. Etch time was approximately 60 seconds.

In a preferred embodiment, the portions of the conformal dielectric film 10 and 12 the polysilicon 12 overlying the field surface are first removed by an in situ etchback at a lower process chamber pressure (i.e., approximately 5 to 10 mT), as shown in FIG. 6a. The lower pressure results in an aggressive, uniform etch with a lower etch selectivity for polysilicon over the silicon nitride etch barrier 8. After the silicon nitride etch barrier 8 has been exposed by removal of the overlying conformal dielectric film 10, a higher pressure (i.e., approximately 20 to 30 mT) etch is used to remove the polysilicon 12 to predetermined depth B, as shown in FIG. 6b. The higher pressure etch has a greater etch selectivity for polysilicon over the silicon nitride etch barrier 8, leaving the etch barrier layer substantially undisturbed.

Section V and Example Two, below, describe a preferred embodiment method of forming a polysilicon-filled trench capacitor which incorporates the method of the present invention for recess etchback of a polysilicon-filled trench, as described above.

V. The Method of Forming a Polysilicon-Filled Trench Capacitor in a Single-Crystal Silicon Substrate The method of forming a trench capacitor in a single-crystal silicon substrate comprises the following steps:

a) providing a trench formed in a semiconductor structure, wherein the structure includes a single-crystal silicon substrate, at least one gate dielectric layer overlying a surface of the substrate, and at least one etch barrier layer overlying the gate dielectric layer;

b) forming a conformal dielectric film overlying the etch barrier layer and the sidewall and bottom of the trench;

c) filling the trench with a layer of polysilicon which overlies the conformal dielectric film;

d) isotropically etching the polysilicon back to a first predetermined depth within the trench using a plasma produced from a plasma source gas comprising a reactive species which selectively etches polysilicon, wherein the plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof;

e) forming a collar comprising a conformal layer of silicon oxide over the etch barrier layer, the sidewall of the trench, and the portion of the polysilicon which was exposed during the etching step (d);

f) anisotropically etching the silicon oxide collar to expose the underlying polysilicon;

g) refilling the trench with polysilicon;

h) isotropically etching the polysilicon back to a second predetermined depth within the trench using a plasma produced from a plasma source gas comprising a reactive species which selectively etches polysilicon, wherein the plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof;

i) performing a wet etch step to remove the upper part of the silicon oxide collar to a third predetermined depth;

j) refilling the trench with polysilicon; and k) isotropically etching the trench to remove the polysilicon to a fourth predetermined depth within the trench and to remove a portion of the single-crystal silicon substrate from the top portion of the sidewall above the silicon oxide collar, thereby forming a buried strap.

Specific process parameters for forming the polysilicon-filled trench capacitor are set forth in Example Two, below.

EXAMPLE TWO

The structure described in Example One, above, and shown in FIG. 3 was provided (step a). A conformal dielectric film 10 was then formed overlying the silicon nitride etch barrier layer 8 and the sidewall 7 and bottom of the trench 3 (step b). The conformal dielectric film 10 was a multi-layered ONO film, as described in Example One. The trench 3 was then filled with a layer 12 of polysilicon overlying the conformal dielectric film 10 (step c). The above steps (a–c) were performed as described in Section IV and Example One, above, and illustrated in FIGS. 3–5.

Recess etchback of the polysilicon layer 12 (step d) was then performed to a predetermined depth within the trench, as illustrated in FIGS. 6a and 6b, using the plasma source gas composition and general process parameters described in Section III, above. This first etchback of polysilicon is referred to herein as "Recess Etch 1". Specific process parameters for Recess Etch 1 were as follows: Gas flow was 100 sccm $SF_6$ and 10 sccm $Cl_2$. The process chamber pressure was 20 mT. An RF source power of 600 W was provided at a frequency of 13.56 MHz. No bias power was provided. Etch time was approximately 60 seconds.

The resulting polysilicon etch front 13, shown in FIG. 6b, was substantially flat, as a result of using the plasma source gas composition set forth in Section III. The importance of having a substantially flat etch front to the performance of subsequent steps of the preferred method of the invention will become apparent upon reading the following disclosure.

Figure 7:
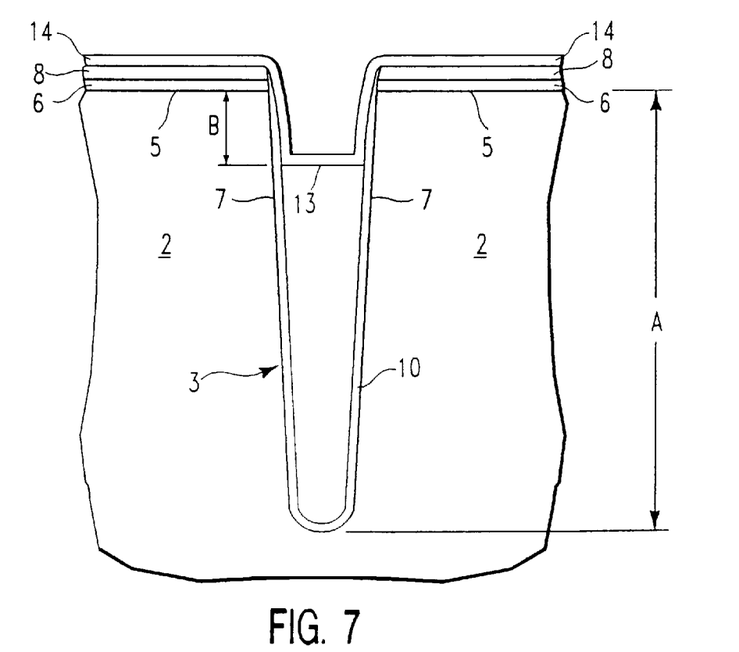
FIG. 7 shows the structure of FIG. 6b after formation of a silicon oxide collar overlying the silicon nitride etch barrier layer, the sidewall of the trench, and the exposed surface of the polysilicon.

Referring to FIG. 7, a collar comprising a conformal layer 14 of silicon oxide was then formed (step e) over the silicon nitride etch barrier layer 8, the trench sidewall 7, and the portion of the polysilicon 13 which was exposed during the etching step (d). The purpose of the collar is to serve as an insulating layer in the final device structure. The actual depth of the collar is determined by the electrical requirements of the trench, which are specified based on the particular end use application of the device.

The silicon oxide collar 14 was formed using LPCVD TEOS with 8–12% $O_3$. In this instance, the thickness of the silicon oxide collar 14 was about 200–300 Å on the field surface 5 and on the sidewall 7.

Figure 8:
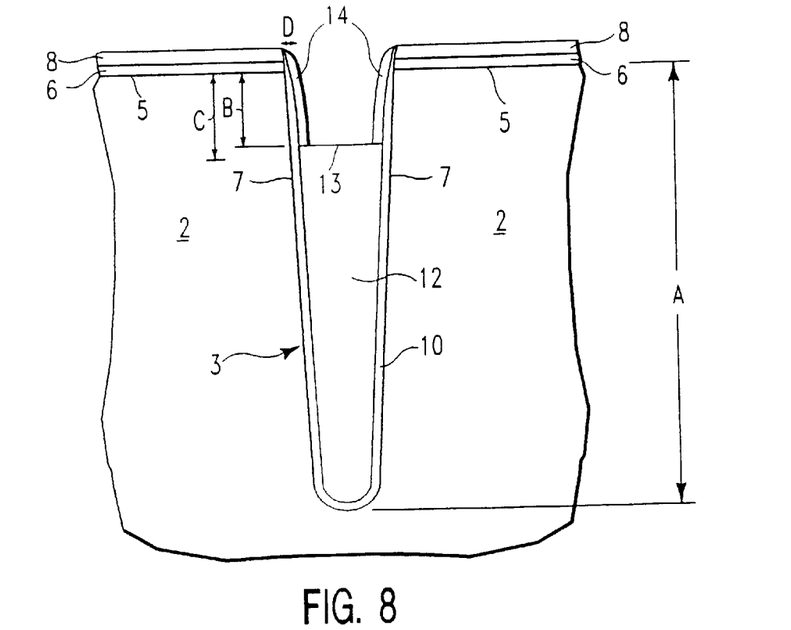
FIG. 8 shows the structure of FIG. 7 after etchback of the silicon oxide layer to a predetermined depth C in order to remove the bottom portion of the silicon oxide collar to expose the underlying polysilicon.

Referring to FIG. 8, the silicon oxide collar 14 was then anisotropically etched (step f) to a predetermined depth C (in this case, approximately 0.15 μm), which is the minimum depth required to remove the field surface portion and the entire bottom portion of the silicon oxide collar 14 and expose the entire surface of the underlying polysilicon 13.

(NOTE: Some overetch into the underlying polysilicon may be required in order to remove all of the silicon oxide at the bottom of the collar.) The goal of the etch step (i) is to remove the portion of the silicon oxide collar 14 on the field surface 5 and the portion of the silicon oxide collar 14 which directly overlies the polysilicon 13, while maintaining at least a minimum thickness D of the silicon oxide conformal layer 14 on the sidewall 7.

A substantially flat polysilicon etch front greatly simplifies removal of the oxide layer 14 from the surface of the polysilicon 13. If the etch front is V-shaped, it can be very difficult to completely remove all of the silicon oxide from the bottom of the V without etching too deeply and altering the specified dimensions and electrical properties of the trench.

The silicon oxide layer 14 was anisotropically etched by $CF_4$ sputtering in an Applied Materials' sputter etch chamber. Alternatively, the silicon oxide layer can be etched by $C_4F_8$-based oxide etch in an Applied Materials' oxide MXP+ chamber.

Figure 9:
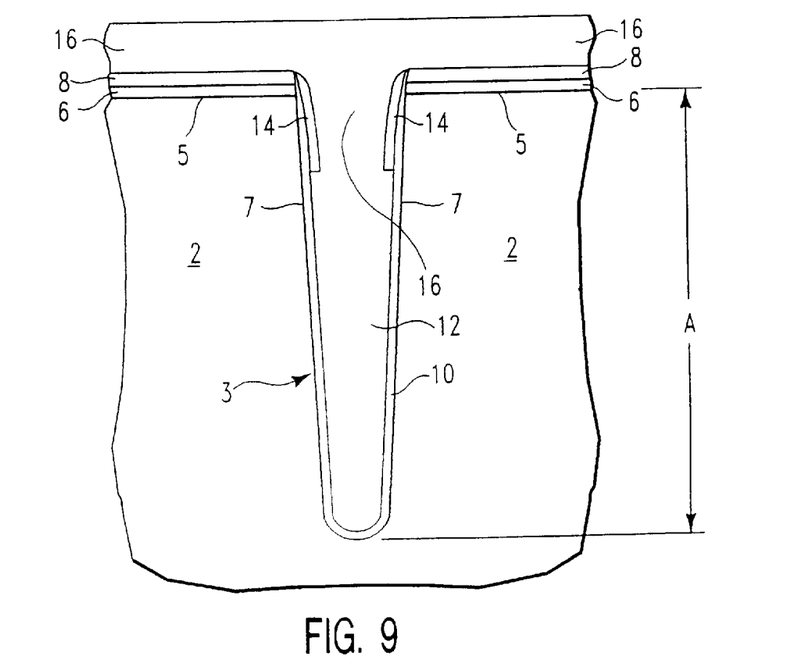
FIG. 9 shows the structure of FIG. 8 after refilling of the trench with polysilicon.

Referring to FIG. 9, the trench 3 was then refilled (step g) with polysilicon 16 as described in Example One, above.

Figure 10A:
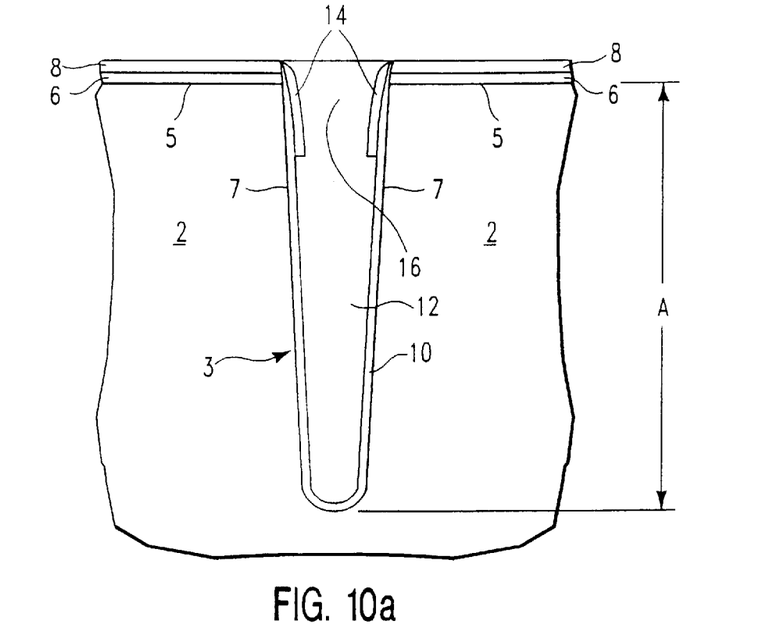
FIGS. 10a and 10b show the structure of FIG. 7 after etchback of the polysilicon layer to a predetermined depth E ("Recess Etch 2").
Figure 10B:
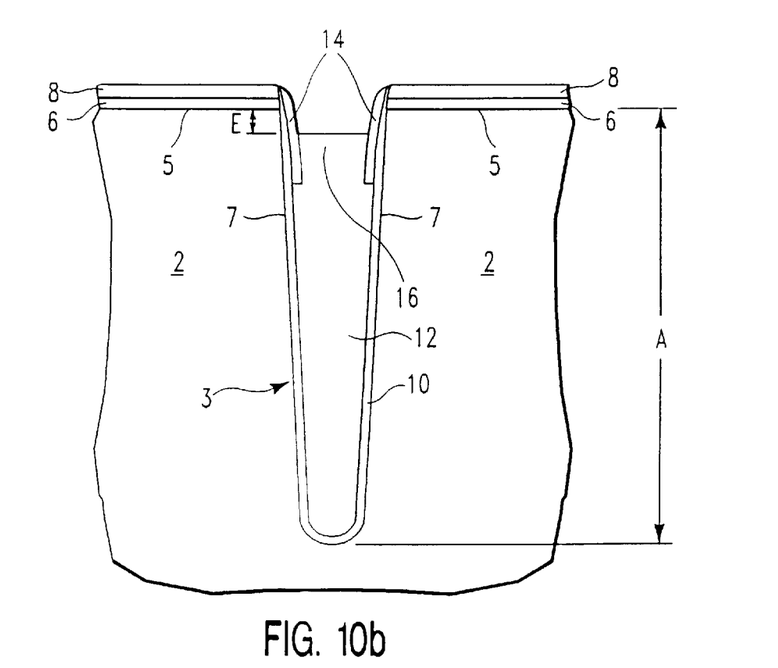

Referring to FIG. 10b, the polysilicon 16 was then etched back (step h) to a predetermined depth E within the trench (in this case, approximately 140–160 nm) using the plasma source gas composition and general process parameters described in Section III, above. This second etchback of polysilicon is referred to herein as "Recess Etch 2". Specific process parameters for Recess Etch 2 were as follows: Gas flow was 30 sccm $SF_6$ and 10 sccm HBr. The process chamber pressure was 10 mT. An RF source power of 200 W was provided at a frequency of 13.56 MHz. No bias power was provided. Etch time was approximately 20 seconds.

In a preferred embodiment, the portion of the polysilicon 16 overlying the field surface 5 is first removed by an in situ etchback at a lower process chamber pressure (i.e., approximately 5 to 10 mT), as shown in FIG. 10a. As described in Example One, above, the lower pressure results in an aggressive, uniform etch with a lower etch selectivity for polysilicon over the silicon nitride etch barrier 8. After the silicon nitride etch barrier 8 has been exposed by removal of the overlying polysilicon layer 16, a higher pressure (i.e., approximately 20 to 30 mT) etch is used to remove the polysilicon 16 to predetermined depth E, as shown in FIG. 10b. The higher pressure etch has a greater etch selectivity for polysilicon over the silicon nitride etch barrier 8, leaving the etch barrier layer substantially undisturbed.

Figure 11:
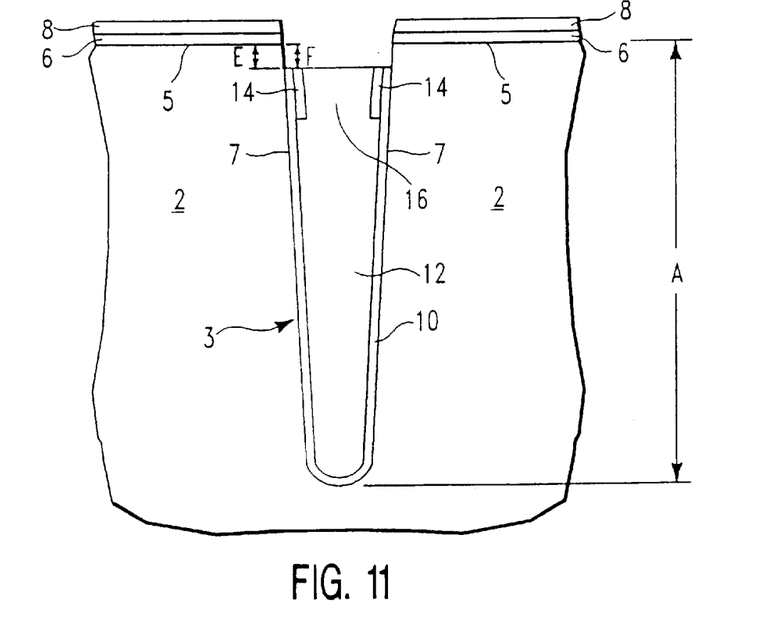
FIG. 11 shows the structure of FIG. 10b after a wet etch step to remove the top portion of the silicon oxide collar to a predetermined depth F.

Referring to FIG. 11, a wet etch step (step i) was then performed to remove the upper portion of the silicon oxide collar 14 to a predetermined depth F (in this case, approximately 140–160 nm). Depth F is typically equal to Depth E, i.e., the silicon oxide collar 14 is etched back such that the top of the collar is even with the top surface of the polysilicon layer 16.

The wet etch step (i) was performed using a buffered HF solution (6:1 buffer: HF ratio).

Figure 12:
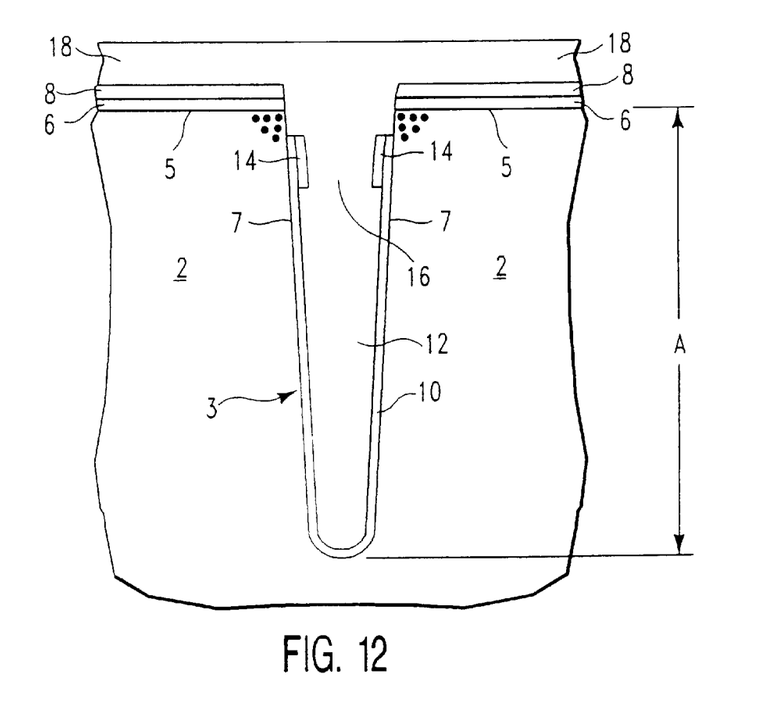
FIG. 12 shows the structure of FIG. 11 after refilling of the trench with a doped polysilicon.

Referring to FIG. 12, the trench 3 was then refilled (step j) with polysilicon 18, as described in Example One, above. The polysilicon preferably contains a dopant such as, for example, arsenic, phosphorus, antimony, or bismuth, to facilitate electron transfer.

Figure 13A:
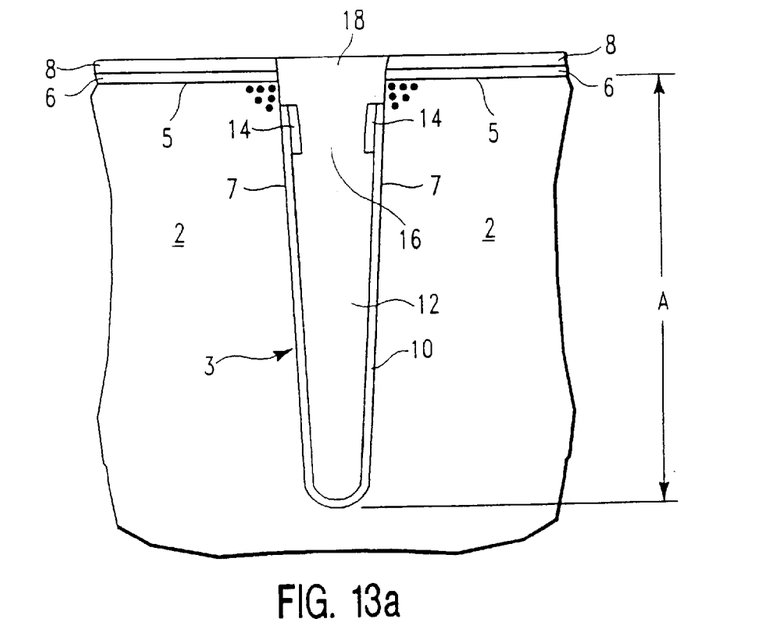
FIGS. 13a and 13b show the structure of FIG. 12 after etchback of the polysilicon layer to a predetermined depth G and removal of a portion of the single-crystal silicon substrate from the top portion of the sidewall above the silicon oxide collar, in order to form the buried strap.
Figure 13B:
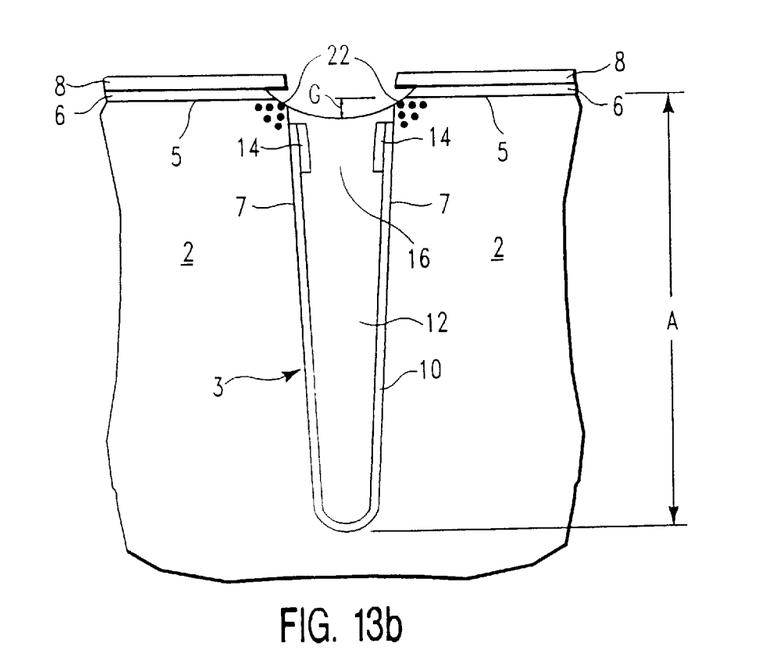

Referring to FIG. 13b, a final isotropic etch step (step k) was performed to remove the polysilicon 18 to a predetermined depth G within the trench (in this case, approximately 0.05 μm) and to remove the corners 20 of the single-crystal silicon substrate 2 from the top portion of the sidewall above the silicon oxide collar 14. A portion of the gate dielectric layer 6 is typically undercut during the removal of the corners 20 of the single-crystal silicon substrate 2. This third etchback of polysilicon is referred to herein as "Recess Etch 3".

The plasma source gas composition and general process parameters described in Section III, above, were used for Recess Etch 3. Specific process parameters for Recess Etch 3 were as follows: Gas flow was 30 sccm $SF_6$ and 10 sccm HBr. The process chamber pressure was 10 mT. An RF source power of 150 W was provided at a frequency of 13.56 MHz. Bias power was 5–10 W. Etch time was approximately 15 seconds.

In a preferred embodiment, the portion of the polysilicon 18 overlying the field surface 5 is first removed by an in situ etchback at a lower process chamber pressure (i.e., approximately 5 to 10 mT), as shown in FIG. 13a. As discussed above, the lower pressure results in an aggressive, uniform etch with a lower etch selectivity for polysilicon over the silicon nitride etch barrier 8. After the silicon nitride etch barrier 8 has been exposed by removal of the overlying polysilicon layer 18, a higher pressure (i.e., approximately 20 to 30 mT) etch is used to remove the polysilicon 18 to predetermined depth G, as shown in FIG. 13b. The higher pressure etch has a greater etch selectivity for polysilicon over the silicon nitride etch barrier 8, leaving the etch barrier layer substantially undisturbed.

The ultimate goal of Recess Etch 3 is to remove the top corners of the single-crystal silicon substrate in order to open up what is known as a "buried strap" 22, which allows electrons to flow from the top portion of the trench to the center section of the trench. The use of a doped polysilicon for at least the last polysilicon fill step (step k) serves to facilitate electron transfer through the strap region. (NOTE: The doped polysilicon in the region of the buried strap is indicated by stippling in FIGS. 10 and 11.) If the etch front is not substantially flat, the electrical properties of the buried strap can vary unpredictably.

The above described preferred embodiments are not intended to limit the scope of the present invention, as one skilled in the art can, in view of the present disclosure, expand such embodiments to correspond with the subject matter of the invention claimed below.

We claim:

1. A method for recess etchback of a polysilicon-filled trench formed in a substrate, wherein the method comprises the steps of:
   a) providing a trench formed in a semiconductor structure, wherein said structure includes a substrate, at least one gate dielectric layer overlying a surface of said substrate, and at least one etch barrier layer overlying said gate dielectric layer;
   b) forming a conformal dielectric film overlying said etch barrier layer and the sidewall and bottom of said trench;
   c) filling said trench with a layer of polysilicon which overlies said conformal dielectric film; and
   d) isotropically etching said polysilicon back to a depth within said trench using a plasma produced from a plasma source gas comprising a reactive species which selectively etches polysilicon, wherein said plasma source gas comprises from about 80% to about 95% by volume of a fluorine-comprising gas, and from about 5% to about 20% by volume of an additive gas selected from the group consisting of a bromine-comprising gas, a chlorine-comprising gas, an iodine-comprising gas, or a combination thereof.

2. The method of claim 1, wherein about 10% by volume of said plasma source gas comprises an additive gas selected from the group consisting of a bromine-comprising gas, a chlorine-comprising gas, an iodine-comprising gas, or a combination thereof.

3. The method of claim 1, wherein from about 5% to about 20% by volume of said plasma source gas comprises an additive gas selected from the group consisting of HBr, $CH_3Br$, $CH_2Br_2$, $Cl_2$, HCl, HI, or a combination thereof.

4. The method of claim 1, wherein from about 5% to about 20% by volume of said plasma source gas comprises an additive gas comprising a bromine-comprising gas and a chlorine-comprising gas.

5. The method of claim 4, wherein from about 5% to about 20% by volume of said plasma source gas comprises an additive gas comprising HBr and $Cl_2$.

6. The method of claim 5, wherein about 10% by volume of said plasma source gas comprises an additive gas comprising HBr and $Cl_2$.

7. The method of claim 1, wherein said fluorine-comprising gas is selected from the group consisting of $SF_6$, $SF_6$, $SF_4$, $S_2F_2$, $S_2F_{10}$, and combinations thereof.

8. The method of claim 7, wherein said fluorine-comprising gas is $SF_6$.

9. The method of claim 1, wherein said plasma source gas mixture further comprises an essentially nonreactive gas.

10. The method of claim 9, wherein said essentially nonreactive gas is helium or argon.

11. The method of claim 1, wherein said gate dielectric layer comprises silicon oxide.

12. The method of claim 1, wherein said etch barrier layer comprises silicon nitride.

13. The method of claim 1, wherein said conformal dielectric film comprises a multi-layered dielectric film.

14. The method of claim 13, wherein said multi-layered dielectric film comprises a layer each of silicon oxide, silicon nitride, and silicon oxynitride.

15. A method of forming a trench capacitor in a single-crystal silicon substrate, wherein said trench capacitor includes a dielectric collar and a buried strap, the method comprising the steps of:
   a) providing a trench formed in a semiconductor structure, wherein said structure includes a single-crystal silicon substrate, at least one gate dielectric layer overlying a surface of said substrate, and at least one etch barrier layer overlying said gate dielectric layer;
   b) forming a conformal dielectric film overlying said etch barrier layer and the sidewall and bottom of said trench;
   c) filling said trench with a layer of polysilicon which overlies said conformal dielectric film;
   d) isotropically etching said polysilicon back to a first depth within said trench using a plasma produced from a plasma source gas comprising a reactive species which selectively etches polysilicon, wherein said plasma source gas comprises from about 80% to about 95% by volume of a fluorine-comprising gas, and from about 5% to about 20% by volume of an additive gas selected from the group consisting of a bromine-comprising gas, a chlorine-comprising gas, an iodine-comprising gas, or a combination thereof;
   e) forming a collar comprising a conformal layer of silicon oxide over said etch barrier layer, the sidewall of said trench, and the portion of said polysilicon which was exposed during the etching step (d);
   f) anisotropically etching said silicon oxide collar to expose said underlying polysilicon;

g) refilling said trench with polysilicon;

h) isotropically etching said polysilicon back to a second depth within said trench using a plasma produced from a plasma source gas comprising a reactive species which selectively etches polysilicon, wherein said plasma source gas comprises from about 80% to about 95% by volume of a fluorine-comprising gas, and from about 5% to about 20% by volume of an additive gas selected from a group consisting of a bromine-comprising gas, a chlorine-comprising gas, an iodine-comprising gas, or a combination thereof;

i) performing a wet etch step to remove the upper part of said silicon oxide collar to a third predetermined depth;

j) refilling said trench with polysilicon; and k) isotropically etching said trench to remove said polysilicon to a fourth predetermined depth within said trench and to remove a portion of said single-crystal silicon substrate from the top portion of said sidewall above said silicon oxide collar, thereby forming a buried strap.

* * * * *